(12) United States Patent
Lee

(10) Patent No.: US 7,456,044 B2
(45) Date of Patent: Nov. 25, 2008

(54) METHOD FOR MANUFACTURING IMAGE SENSOR

(75) Inventor: Kwan Yul Lee, Anyang-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 4 days.

(21) Appl. No.: 11/611,394

(22) Filed: Dec. 15, 2006

(65) Prior Publication Data
US 2007/0161146 A1 Jul. 12, 2007

(30) Foreign Application Priority Data
Dec. 28, 2005 (KR) .............. 10-2005-0131289
Dec. 28, 2005 (KR) .............. 10-2005-0132256

(51) Int. Cl.
*H01L 21/00* (2006.01)
(52) U.S. Cl. .............. 438/65; 438/69; 257/E21.617; 257/E27.133; 257/E31.127
(58) Field of Classification Search .......... 438/65, 438/69, 75; 257/E21.026, E21.617, E27.133, 257/E31.127
See application file for complete search history.

(56) References Cited

U.S. PATENT DOCUMENTS

| 4,258,122 A * | 3/1981 | Uchida et al. ............ 430/253 |
| 6,623,668 B1 * | 9/2003 | Murakami et al. ......... 264/1.36 |
| 2002/0051071 A1 * | 5/2002 | Itano et al. .............. 348/340 |
| 2003/0062334 A1 * | 4/2003 | Lee et al. ................ 216/37 |
| 2004/0167312 A1 * | 8/2004 | Miyagi et al. ............ 528/129 |
| 2006/0131767 A1 * | 6/2006 | Wake .................... 264/1.32 |
| 2006/0189062 A1 * | 8/2006 | Deng et al. .............. 438/201 |

FOREIGN PATENT DOCUMENTS

KR 10-2000-0049265 3/2002

* cited by examiner

*Primary Examiner*—Trung Dang
(74) *Attorney, Agent, or Firm*—Saliwanchik, Lloyd & Saliwanchik

(57) ABSTRACT

A method of manufacturing an image sensor using a microlens mold is provided. The method includes: forming an interlayer dielectric layer on a semiconductor substrate having photodiodes; forming color filter layers on the interlayer dielectric layer; forming a planarization layer on the color filter layers; coating photoresist on the planarization layer; aligning a mold having a lens shaped pattern on the semiconductor substrate with the photoresist applied thereon; pressing the mold and the semiconductor substrate closely to each other such that a pattern formed in the mold is transferred onto the photoresist; and separating the mold from the semiconductor substrate, thereby forming micro-lenses.

17 Claims, 8 Drawing Sheets

METHOD FOR MANUFACTURING IMAGE SENSOR

RELATED APPLICATION(S)

This application claims the benefit under 35 U.S.C. §119 (e) of Korean Patent Application Nos. 10-2005-0132256 filed Dec. 28, 2005 and 10-2005-0131289 filed Dec. 28, 2005, both of which are incorporated herein by reference in their entireties.

FIELD OF THE INVENTION

The present invention relates to a method of manufacturing an image sensor.

BACKGROUND OF THE INVENTION

In general, image sensors are semiconductor devices for converting optical images into electric signals, and are generally classified as charge coupled devices (CCDs) or CMOS (Complementary Metal Oxide Semiconductor) image sensors.

The CMOS image sensor includes a photodiode for detecting light and a logic circuit for converting detected light into electric signals representing image data. As the quantity of light received in the photodiode increases, the photo sensitivity of the image sensor is improved.

To improve the photo sensitivity, either a fill factor, which is the ratio of a photodiode area to the whole area of the image sensor, must be increased, or a photo-gathering technology is used to change the path of light incident onto an area other than the photodiode area such that the light can be gathered in the photodiode.

A representative example of the photo-gathering technology is to make a micro-lens. That is, a convex micro-lens is formed on a top surface of a photodiode region using a material having superior light transmittance, thereby refracting the path of incident light in such a manner that a greater amount of light can be transmitted into the photo-diode.

In this case, light parallel with an optical axis of the micro-lens is refracted by the micro-lens so that the light is focused on a certain position of the optical axis.

Meanwhile, since resolution is determined depending on the number of photodiodes receiving images, the current tendency has tended toward increasing the number of pixels (high-pixels) and miniaturizing the size of the pixels (micro-sized pixels), when manufacturing elements for an image sensor.

Because of the development of the micro-sized pixels and the high-pixels, external images are input into an image plane through a micro-lens.

Color filters are formed with primary color filter layers or complementary color filter layers for the purpose of color reproduction. That is, the color filters are formed through an on-chip scheme in such a manner that the primary color filter layers can reproduce red, green and blue colors, and the complementary color filter layers reproduce cyan, yellow and magenta colors through color separation.

Meanwhile, in order to effectively and appropriately utilize incident light, a micro-lens is provided to improve light condensing efficiency. The micro-lens is formed by thermally reflowing photoresist.

However, when reflowing the photoresist to maximize the size of the micro-lens such that a greater amount of light can be condensed, a bridge is produced between neighboring micro-lenses. For this reason, a CD (Critical Dimension) is maintained in a certain degree to enhance uniformity.

Among the image sensors having the aforementioned feature, the CMOS image sensor is classified into 3T-type, 4T-type, 5T-type or the like depending on the number of transistors in each unit pixel. The 3T-type CMOS image sensor includes one photodiode and three transistors, and the 4T-type CMOS image sensor includes one photodiode and four transistors. An equivalent circuit and a layout for a unit pixel of the 3T-type CMOS image sensor is described below with reference to FIGS. 1 and 2.

FIG. 1 is an equivalent circuit diagram of a general 3T-type CMOS image sensor, and FIG. 2 is a layout showing a unit pixel of a general 3T-type CMOS image sensor.

As shown in FIG. 1, the unit pixel of a conventional 3T-type CMOS image sensor includes one photodiode PD and three nMOS transistors T1, T2 and T3. The cathode of the photodiode PD is connected to the drain of the first NMOS transistor T1 and the gate of the second nMOS transistor T2.

The sources of the first and second nMOS transistors T1 and T2 are connected to a power source line through which a reference voltage VR is supplied, and the gate of the first NMOS transistor T1 is connected to a reset line through which a reset signal RST is supplied.

The source of the third nMOS transistor T3 is connected to the drain of the second nMOS transistor T2, the drain of the third nMOS transistor T3 is connected to a reading circuit (not shown) through a signal line, and the gate of the third nMOS transistor T3 is connected to a row selection line through which a selection signal SLCT is supplied.

Thus, the first, second and third nMOS transistors T1, T2 and T3 are referred to as reset, drive and selection transistors Rx, Dx and Sx, respectively.

Referring to FIG. 2, in the unit pixel of the conventional CMOS image sensor, an active region 10 is defined having a wide portion and a narrow portion. A photodiode 20 is formed on the portion having a broad width in the active region 10, and gate electrodes 30, 40 and 50 of three transistors are formed overlapping the narrow portion of the active region 10.

That is, reset, drive and selection transistors Rx, Dx and Sx are formed by the gate electrodes 30, 40 and 50, respectively.

Here, impurity ions are implanted into portions of the active region 10 except below each of the gates 30, 40 and 50 of each of the transistors so as to form a source/drain region for each of the transistors. Thus, a power source voltage Vdd is supplied into the source/drain region between the reset and drive transistors Rx and Dx, and a reading circuit (not shown) is connected to the source/drain region at one side of the select transistor Sx.

Although not shown in the figures, the gate electrodes 30, 40 and 50 described above are respectively connected to signal lines, and each of the signal lines are provided with a pad at one end thereof to be connected to an external driving circuit.

Hereinafter, a method of manufacturing a CMOS image sensor according to the related art will be described with reference to the accompanying drawings.

FIGS. 3 to 6 are sectional views illustrating a method of manufacturing a CMOS image sensor according to the related art.

Referring to FIG. 3, an interlayer dielectric layer 13 is formed on a semiconductor substrate 11 having a plurality of light sensing elements, e.g., photodiodes 12.

Here, the interlayer dielectric layer 13 may be formed as multiple layers.

Then, a dyeable resist is coated on the interlayer dielectric layer 13, and color filter layers 14 for filtering light for each wavelength band are then formed by performing an exposure and development process.

Subsequently, a planarization layer 15 is formed on the color filter layers in order to adjust a focus distance and secure planarity for forming a lens layer.

Referring to FIG. 4, a resist layer 16a for forming micro-lenses is applied on the planarization layer 15, and a reticle 17 with openings is aligned above the resist layer 16a.

Subsequently, the resist layer 16a is selectively exposed to correspond to the openings of the reticle 17 by radiating light such as laser onto the semiconductor substrate 11 through the reticle 17.

Referring to FIG. 5, the exposed resist layer 16a is developed to form micro-lens patterns 16b.

Referring to FIG. 6, hemispherical micro-lenses 16 are formed by reflowing the micro-lens patterns 16b at a predetermined temperature.

However, since micro-lenses are formed through a reflowing method in the aforementioned CMOS image sensor according to the related art, there are some problems as follows:

First, it is very difficult to control bleaching and reflowing processes after exposing and developing processes due to the sensitivity of the photoresist for micro-lenses.

That is, the intervals between micro-lenses may form unequally. For example, as shown in FIG. 6, interval width A is narrower than interval width B.

Second, since micro-lenses are very sensitive to the thermal process, high-priced equipment capable of fine temperature adjustment is required. When the temperature is not adjusted properly, it is difficult to form perfect spherical lenses.

That is, where a temperature is not adjusted properly, lenses may connect to each other or may be separated by a long distance so that precise images cannot be obtained. The formation of perfectly spherical lenses has become an important point for determining the quality of a complimentary oxide semiconductor image sensor.

The latest technology trend focuses on techniques for reducing the path of light to enhance the quality of the image sensors. One such technique incorporates aligning the micro-lenses to as low a portion as possible after the process for forming complimentary metal oxide has been finished.

In addition, there is a case where the micro-lens is formed after reducing the thickness of a passivation layer before the lens of the image sensor is formed. In this case, if the conventional semiconductor process is used, uniformity of photoresist becomes bad due to the step difference, and the aperture or shape of a lens adjacent to the stepped portion becomes deteriorated when forming the lenses.

SUMMARY OF THE INVENTION

Accordingly, an object of embodiments of the present invention is to provide a method of manufacturing an image sensor, wherein micro-lenses are formed using an imprint method so that the micro-lenses can be uniformly formed, and a characteristic of the image sensor can be enhanced.

In accordance with a preferred embodiment of the present invention, there is provided a method of manufacturing an image sensor, including: forming an interlayer dielectric layer on a semiconductor substrate having photodiodes; forming color filter layers on the interlayer dielectric layer; forming a planarization layer on the color filter layers; coating photoresist on the planarization layer; aligning a mold with the shape of a lens patterned therein on the semiconductor substrate with the photoresist applied thereon; pressing the mold and the semiconductor substrate closely to each other such that a pattern formed in the mold is transferred onto the photoresist; and separating the mold from the semiconductor substrate to form micro-lenses.

DETAILED DESCRIPTION OF THE INVENTION

Hereinafter, a method of manufacturing an image sensor according to embodiments of the present invention will be described with reference to the accompanying drawings.

FIGS. 7 to 10 are sectional views illustrating a process of forming a pattern with a desired shape using an imprint lithography method according to an embodiment of the present invention.

Figure 7:
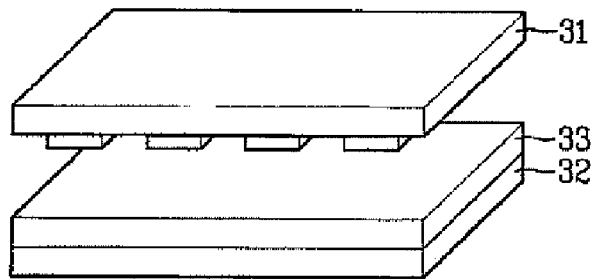
FIGS. 7 to 10 are sectional views illustrating a process of forming a pattern with a desired shape using an imprint lithography method.

Referring to FIG. 7, a solid mold 31 can be prepared with a desired pattern formed thereon. In one embodiment, the solid mold 31 can be formed of silicon or the like.

A thermoplastic polymer thin film 33 can be formed by being coated on a semiconductor substrate 32.

The mold 31 with the pattern formed thereon can be aligned above the semiconductor substrate 32 with the polymer thin film 33 coated thereon.

Figure 8:
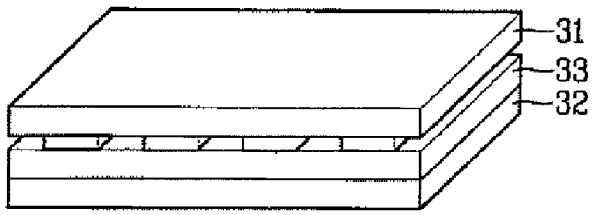

Referring to FIG. 8, the mold 31 with the pattern formed thereon and the semiconductor substrate 32 with the polymer thin film 33 formed thereon can be aligned such that the formed pattern faces the polymer thin film 33.

Figure 9:
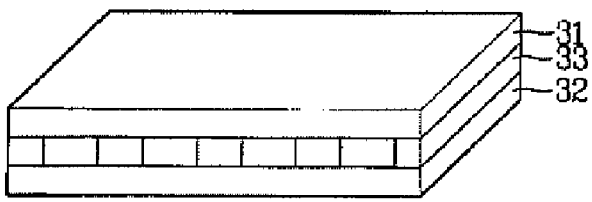

Referring to FIG. 9, the semiconductor substrate 32 and the mold 31 can be introduced between press plates so as to be treated at high temperature and high pressure in a state in which they are in close contact with each other. The press plates can cause the formed pattern to press into the polymer thin film 33.

Figure 10:
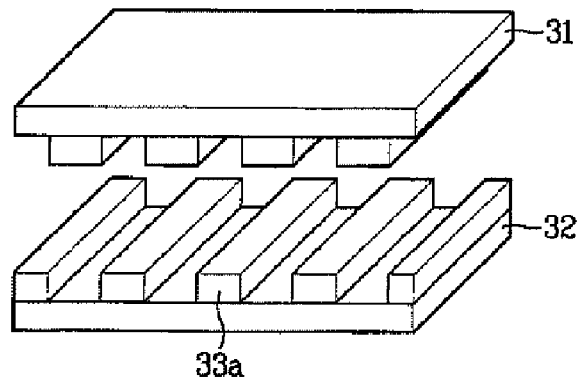

Referring to FIG. 10, when the semiconductor substrate 32 and the mold 31 are separated from each other, it can be seen that the pattern formed on the mold 31 is transferred onto the polymer thin film 33 formed on the semiconductor substrate 32 such that a polymer thin film pattern 33a is formed.

Because a solid mold of Si or the like can be used in the aforementioned imprint lithography method, there is an advantage in that a pattern can be easily implemented up to about 6 nm.

FIGS. 11 to 18 are sectional views illustrating a method of manufacturing an image sensor according to a first embodiment of the present invention.

Figure 1:
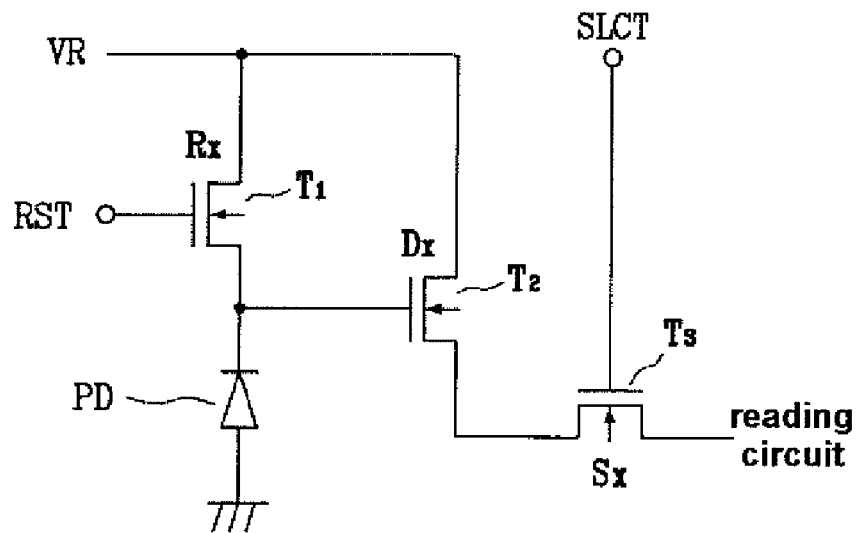
FIG. 1 is an equivalent circuit diagram of a general 3T-type CMOS image sensor.
Figure 2:
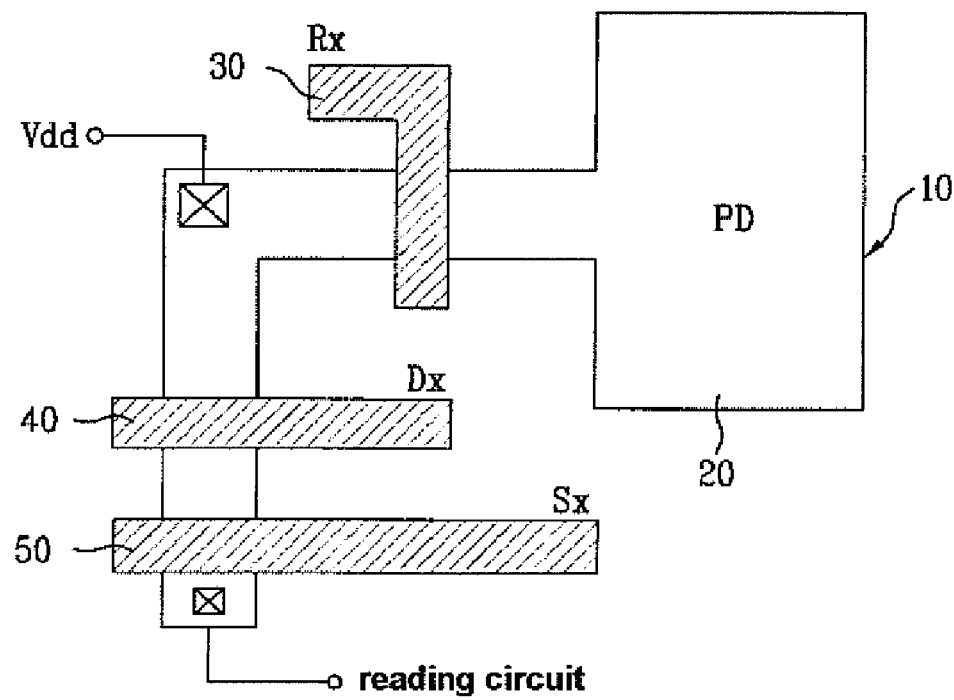
FIG. 2 is a layout showing a unit pixel of a general 3T-type CMOS image sensor.
Figure 3:
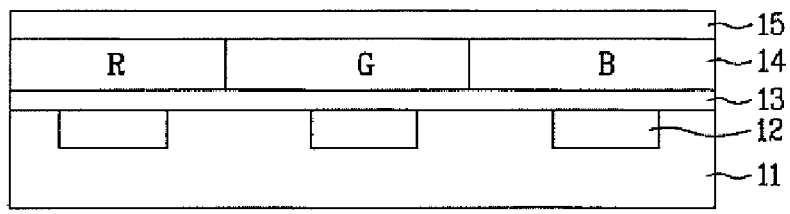
FIGS. 3 to 6 are sectional views illustrating a method of manufacturing a CMOS image sensor according to the related art.
Figure 4:
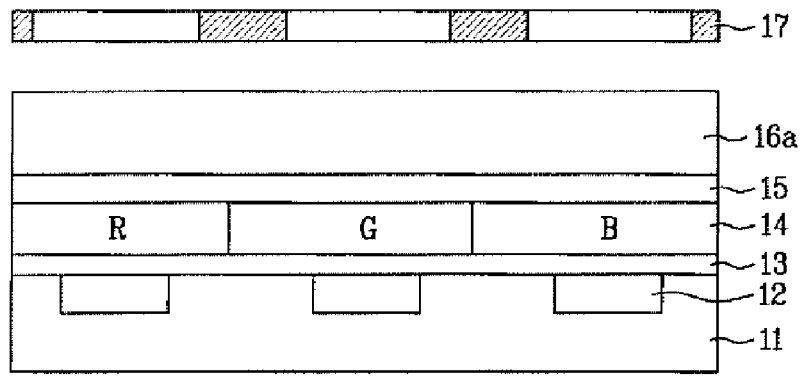
Figure 5:
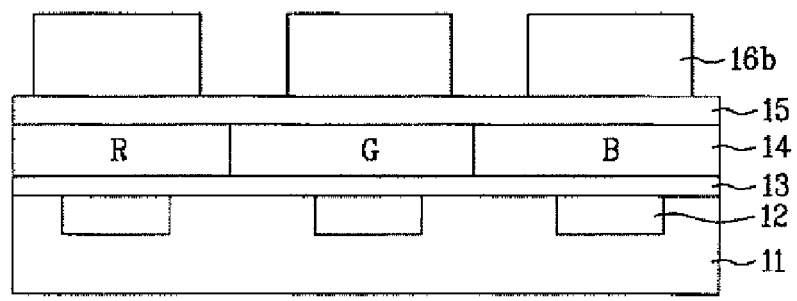
Figure 6:
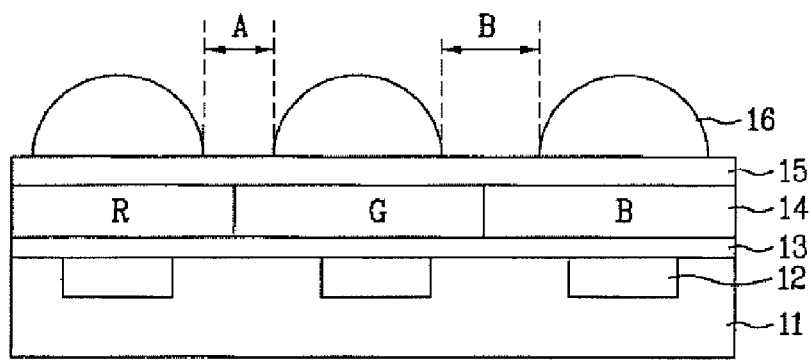
Figure 11:
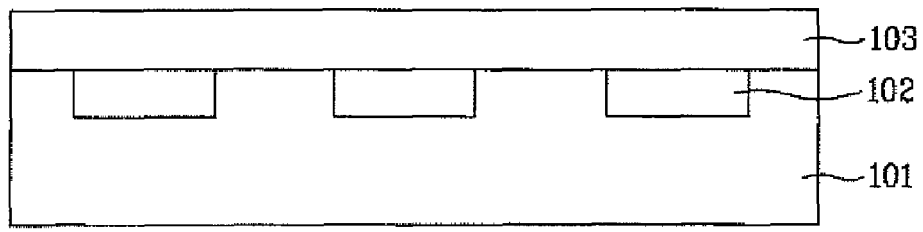
FIGS. 11 to 18 are sectional views illustrating a method of manufacturing an image sensor according to a first embodiment of the present invention.

Referring to FIG. 11, an interlayer dielectric layer 103 can be formed on a semiconductor substrate 101 having a plurality of light sensing elements, e.g., photodiodes 102, and various transistors (such as shown in FIG. 1).

In one embodiment, the interlayer dielectric layer 103 can be formed as multiple layers. Although not shown in the figures, after one interlayer dielectric layer is formed, a light shielding layer can be formed to prevent light from being incident onto a portion of the substrate between the regions of the photodiodes 102, and then another interlayer dielectric layer can be formed on the light shielding layer.

Figure 12:
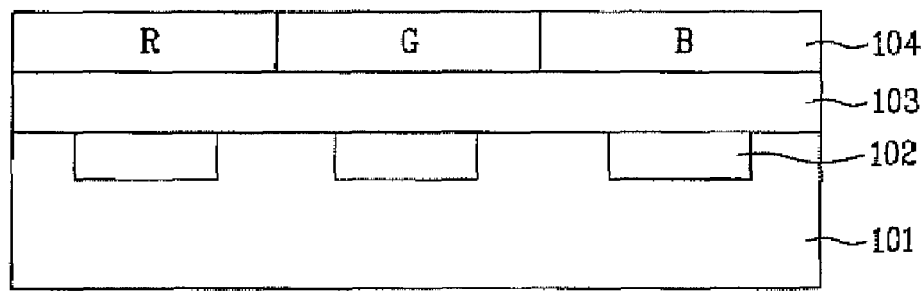

Referring to FIG. 12, a dyeable resist can be applied on the interlayer dielectric layer 103, and color filter layers (R, G, B) 104 for filtering light for each wavelength band can then be formed by performing an exposing and developing process.

In a specific embodiment, the color filter layers 104 for filtering light for each wavelength band can be formed as a single layer by applying a corresponding photoresist material, and patterning the photoresist material through a photo-etching process using an additional mask. In one embodiment, the color filter layers 104 can have a thickness of 1 to 5 μm.

Figure 13:
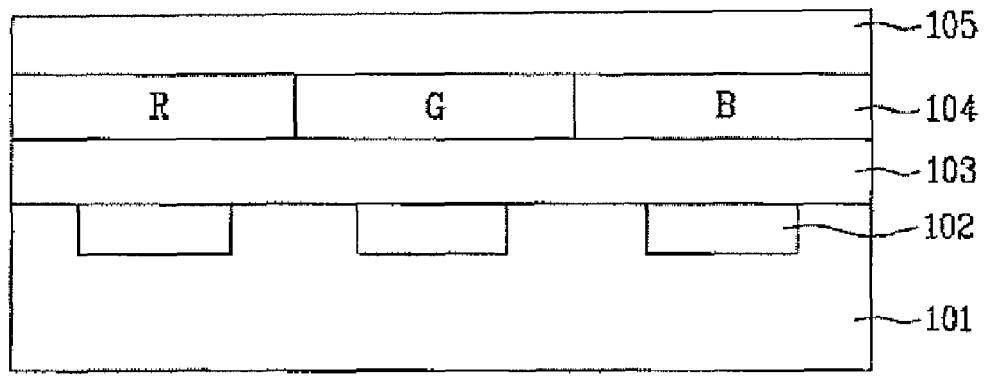

Referring to FIG. 13, in order to obtain reliability and EMC in packaging and to prevent the penetration of moisture or a heavy metal from the outside, a planarization layer 105 can be formed by, for example, depositing a silicon nitride film on the entire surface of the semiconductor substrate 101 including the color filter layers 104.

Because optical transmission is very important in an image sensor, the planarization layer 105 can be formed to have a thickness of 1000 Å to 6000 Å so as to eliminate an interference phenomenon of thin films due to the thickness thereof.

Here, a desired bonding pad (not shown) can be formed for interconnection by opening pad and scribe line sections of the planarization layer 105 and then performing a dry or wet etching using photoresist as an etch mask.

Figure 14:
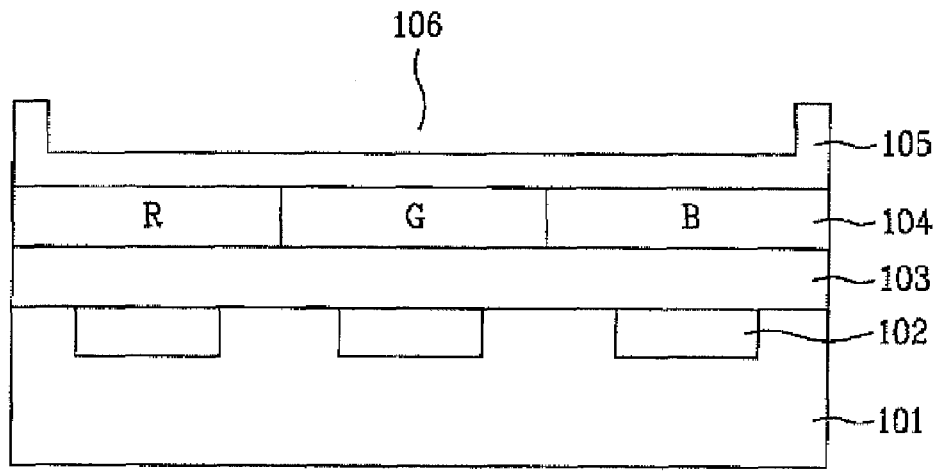

Referring to FIG. 14, in order to increase an amount of light incident onto the photodiodes 102, a trench 106 with a predetermined depth from a surface of the planarization layer 105 can be formed by selectively removing a portion of the planarization layer 105 at which micro-lenses will be formed later.

Figure 15:
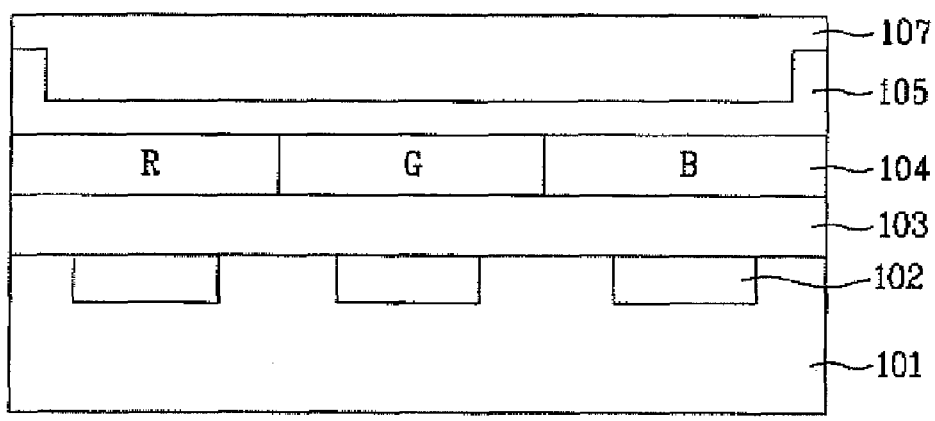

Referring to FIG. 15, a photoresist 107 for micro-lenses can be coated on the entire surface of the semiconductor substrate 101 including in the trench 106.

Figure 16:
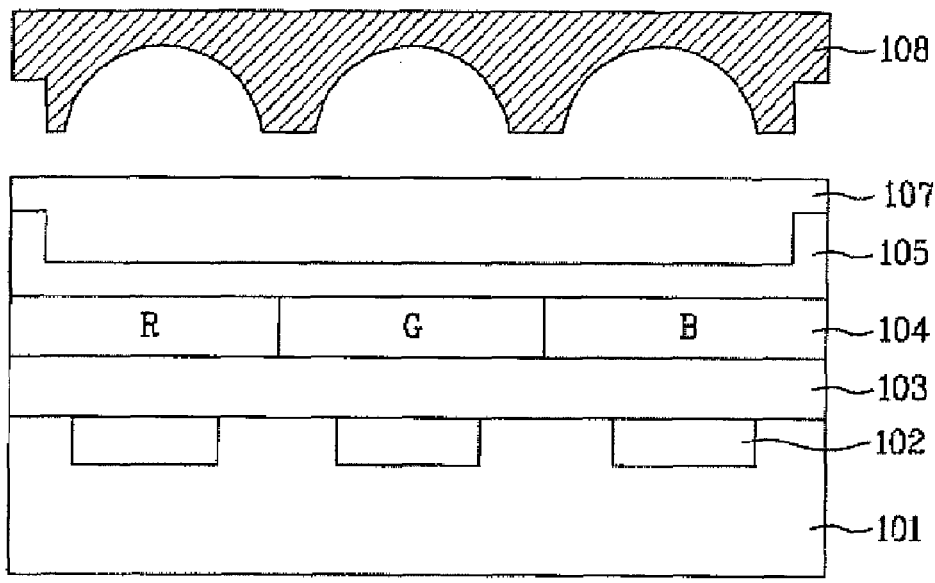

Referring to FIG. 16, a mold 108 in which a pattern is formed in the shape of a desired lens (e.g., a hemispheric shape) can be aligned above the semiconductor substrate 101 having the photoresist 107 applied thereon.

In one embodiment, PDMS (poly dimethylsiloxane) can be used as a material for the mold 108.

Figure 17:
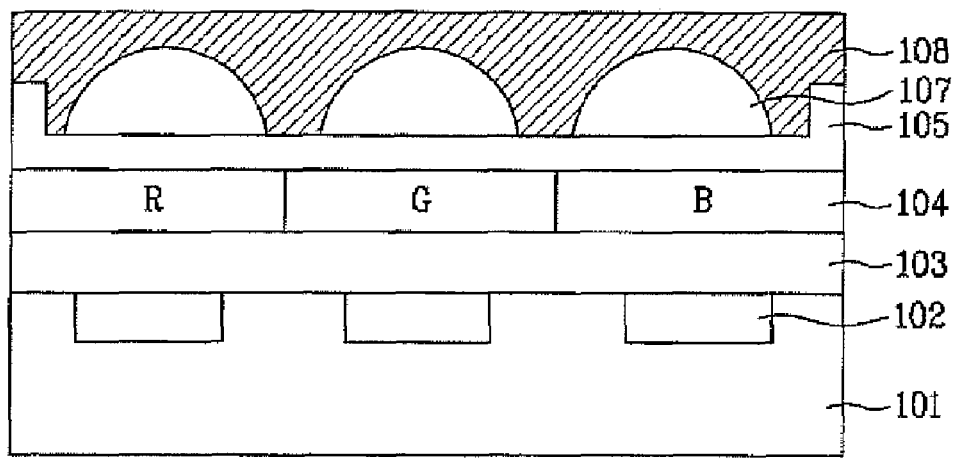

Referring to FIG. 17, the mold 108 and the semiconductor substrate 101 having the photoresist 107 applied thereon can be pressed into close contact with each other, and a thermal process is then performed while applying pressure thereto.

The thermal process can be performed such that the photoresist 107 can maintain the shape imprinted by the pattern of the mold 108.

Figure 18:
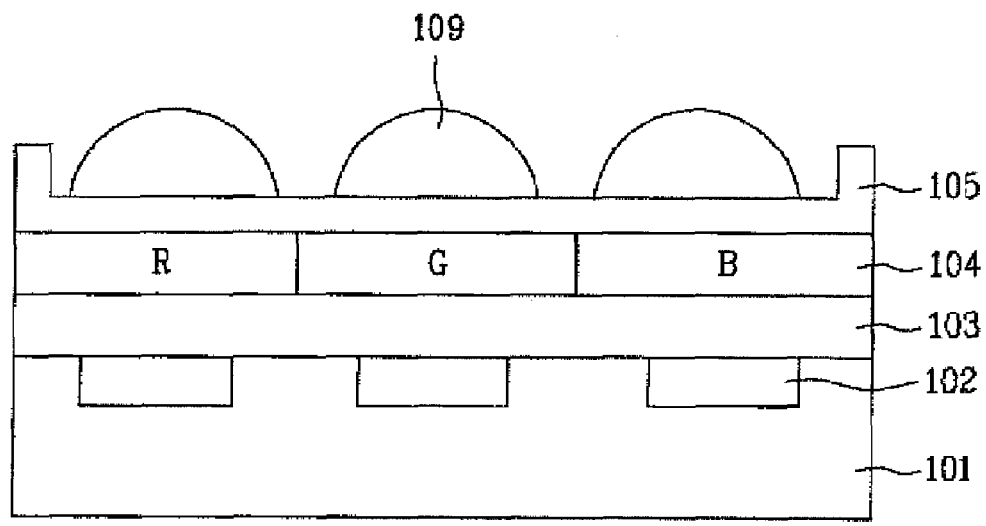

Referring to FIG. 18, the mold 108 can be separated from the semiconductor substrate 101 to form micro-lenses 109 having the same shape as the pattern of the mold 108 within the trench 106 of the planarization layer 105.

Accordingly, in embodiments of the present invention, the distance between the micro-lens 109 and the photodiode 102 can be reduced by forming the trench 106 on the planarization layer 105 and then forming the micro-lenses 109 so that loss of light incident onto the photodiode 102 through the micro-lens 109 can be minimized, thereby enhancing the sensitivity of the image sensor.

FIGS. 19 to 23 are sectional views illustrating a method of manufacturing an image sensor according to a second embodiment of the present invention.

Figure 19:
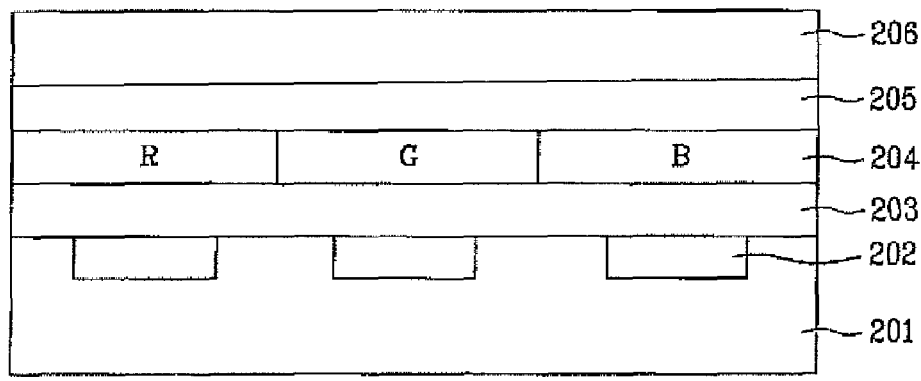
FIGS. 19 to 23 are sectional illustrating a method of manufacturing an image sensor according to a second embodiment of the present invention.

Referring to FIG. 19, photodiodes 202 can be formed within a semiconductor substrate 201, and an interlayer dielectric layer 203 can be formed on the semiconductor substrate 201.

Then, color filter layers (R, G, B) 204 for filtering light can be formed on the interlayer dielectric layer 203 using a dyeable resist.

Thereafter, a planarization layer 205 can be formed on the color filter layers 204, and a photoresist 206 for micro-lenses can be applied on the planarization layer 205.

Such processes can be the same as described above in reference to the first embodiment.

Figure 20:
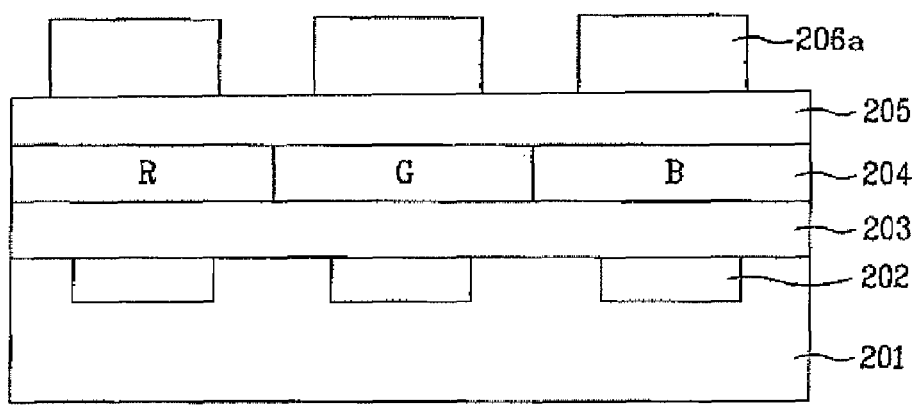

Referring to FIG. 20, the photoresist 206 can be selectively patterned through an exposing and developing process to form micro-lens patterns 206a having a predetermined interval.

Figure 21:
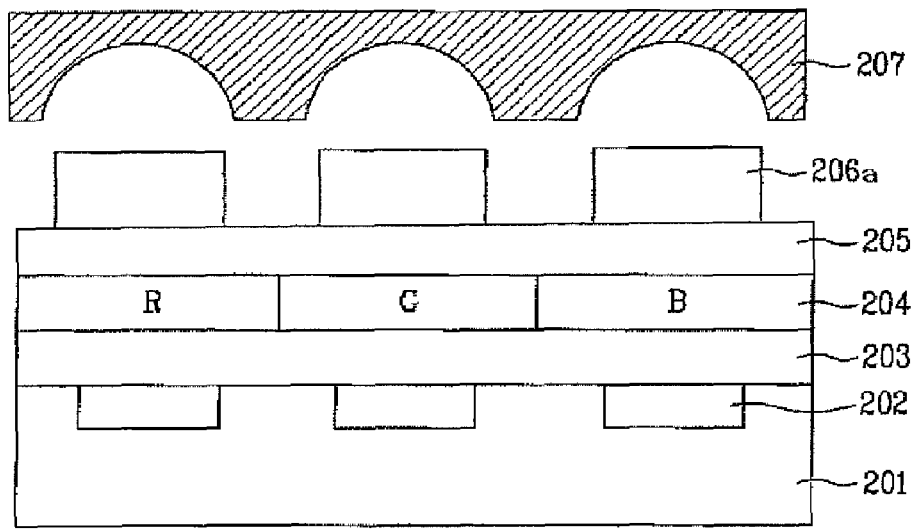

Referring to FIG. 21, a mold 207 in which a pattern is formed in the shape of a desired lens (e.g., a hemisphere) can be aligned above the semiconductor substrate 201 having the micro-lens patterns 206a formed thereon.

In one embodiment, PDMS (poly dimethylsiloxane) can be used as a material of the mold 207.

Figure 22:
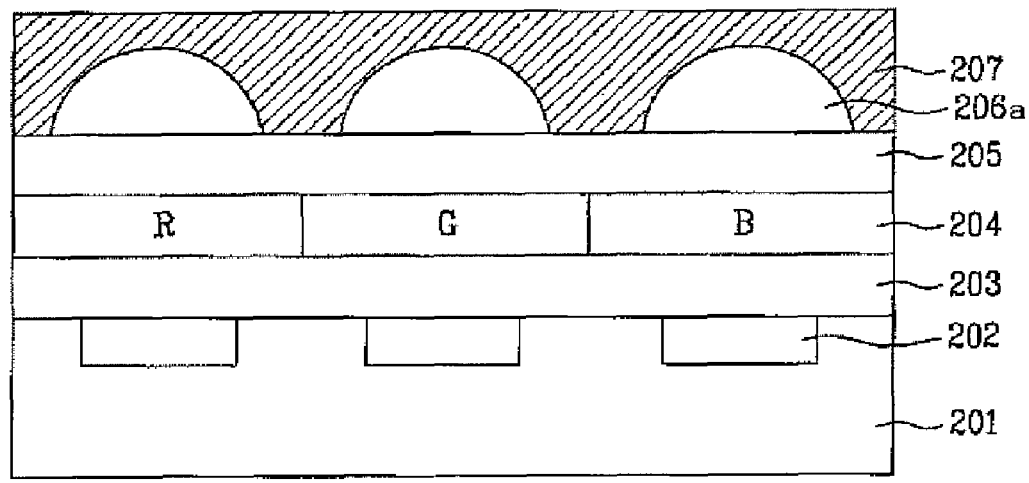

Referring to FIG. 22, the mold 207 and the semiconductor substrate 201 having the micro-lens patterns 206a formed thereon can be pressed into close contact with each other, and a thermal process is then performed while applying pressure thereto.

The thermal process can be performed such that the micro-lens pattern 206a can maintain an exact shape after the mold 207 has imprinted the semiconductor substrate 201 with the micro-lens patterns 206a formed thereon.

Figure 23:
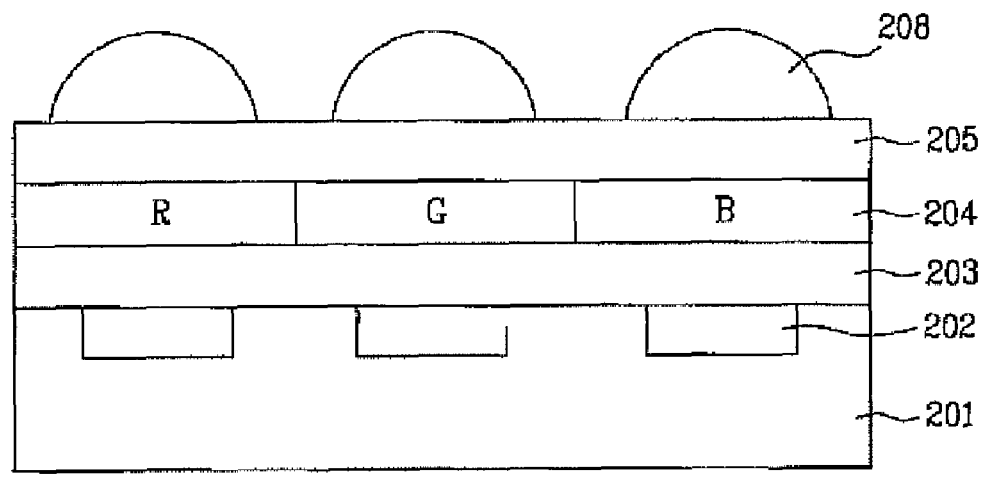

Referring to FIG. 23, the mold 207 can be separated from the semiconductor substrate 201 to reveal micro-lenses 208 having the same shape as the pattern of the mold 207 on the planarization layer 205.

As described above, a method of manufacturing a CMOS image sensor according to embodiments of the present invention has advantages as follows.

That is, micro-lenses with a desired shape can be formed using an imprint method in the present invention so that advantages can be expected as follows:

First, the exact shape of a micro-lens can be formed without requiring a reflow process. In particular, embodiments of the subject method can form the micro-lenses while maintaining proper interval spacing.

Second, although the conventional method of forming a lens has a disadvantage in that the shape of the lens may change depending on a condition of a heating and exposing process, a precisely designed mold can be imprinted into the photoresist so that factors adversely effecting the shape of a lens can be reduced.

Third, although a heating and exposing process should be performed again after a general photo process in the conventional method of forming a lens, such a process is shortened in the present invention so that productivity can be enhanced.

It should be understood that the examples and embodiments described herein are for illustrative purposes only and that various modifications or changes in light thereof will be suggested to persons skilled in the art and are to be included within the spirit and purview of this application.

I claim:

1. A method of manufacturing an image sensor, comprising:

forming an interlayer dielectric layer on a semiconductor substrate having photodiodes;

forming color filter layers on the interlayer dielectric layer;

forming a planarization layer on the color filter layers;

coating photoresist on the planarization layer;

selectively patterning the photoresist coated on the planarization layer;

aligning a mold having a lens-shaped pattern on the semiconductor substrate having patterned photoresist;

pressing the mold and the semiconductor substrate closely to each other such that the pattern formed in the mold is transferred onto the patterned photoresist; and separating the mold from the semiconductor substrate thereby forming micro-lenses, wherein the mold is aligned such that the lens-shaped pattern formed in the mold is positioned on the patterned photoresist.

2. The method of claim 1, wherein pressing the mold and the semiconductor substrate closely to each other comprises simultaneously applying predetermined pressure and heat to the mold and the semiconductor substrate for transferring the pattern formed in the mold onto the photoresist.

3. The method of claim 1, further comprising selectively removing a portion of the planarization layer to form a trench in the planarization layer.

4. The method of claim 3. wherein coating the photoresist on the planarization layer applies the photoresist into the trench.

5. The method of claim 4, wherein the micro-lenses are formed within the trench.

6. The method of claim 1, wherein the planarization layer comprises silicon nitride.

7. The method of claim 1, wherein the planarization layer has a thickness of about 1000 Å to 6000 Å.

8. The method of claim 1, wherein the mold is formed of PDMS (poly dimethylsiloxane).

9. The method of claim 1. wherein the lens-shaped pattern is a hemispherical pattern.

10. A method of manufacturing an image sensor, comprising:

forming an interlayer dielectric layer on an entire surface of a semiconductor substrate formed thereon with a plurality of photodiodes and transistors;

forming color filter layers on the interlayer dielectric layer corresponding to the plurality of photodiodes;

forming a planarization layer on the entire surface of the semiconductor substrate including the color filter layers;

coating photoresist on the planarization layer;

selectively patterning the photoresist to form micro-lens patterns having a predetermined interval;

aligning a mold having a desired lens-shaped pattern on the semiconductor substrate formed thereon with the micro-lens patterns;

pressing the mold closely with the semiconductor substrate having the micro-lenses patterns, and applying predetermined pressure and heat thereto, such that the lens-shaped pattern formed in the mold is transferred onto the photoresist; and separating the mold from the semiconductor substrate. thereby forming the micro-lenses on the planarization layer.

11. The method of claim 10, wherein the planarization layer comprises silicon nitride.

12. The method of claim 10, wherein the planarization layer has a thickness of 1000 Å to 6000 Å.

13. The method of claim 10, wherein the mold is formed of PDMS (poly dimethylsiloxane).

14. A method of manufacturing an image sensor, the method comprising the steps of:

forming an interlayer dielectric layer on an entire surface of a semiconductor substrate formed thereon with a plurality of photodiodes and various transistors;

forming color filter layers on the interlayer dielectric layer in correspondence with the photodiodes;

forming a planarization layer on the entire surface of the semiconductor substrate including the color filter layers;

selectively removing a portion of the planarization layer to form a trench;

coating photoresist on the entire surface of the semiconductor substrate including the trench;

selectively patterning the photoresist to form micro-lens patterns having a predetermined interval;

aligning a mold having a desired lens-shaped pattern on the semiconductor substrate coated with the photoresist having the micro-lens patterns;

pressing the mold closely with the semiconductor substrate coated with the photoresist having the micro-lens patterns, and applying predetermined pressure and heat thereto such that the lens-shaped pattern of the mold is transferred onto the micro-lens patterns; and removing the mold from the semiconductor substrate, thereby forming micro-lenses within the trench of the planarization layer.

15. The method of claim 14, wherein the planarization layer comprises silicon nitride.

16. The method of claim 14, wherein the planarization layer has a thickness of about 1000 Å to 6000 Å.

17. The method of claim 14, wherein the mold is formed of PDMS (poly dimethylsiloxane).

* * * * *